US010651332B2

(12) United States Patent
Moussy

(10) Patent No.: US 10,651,332 B2
(45) Date of Patent: May 12, 2020

(54) SPAD PHOTODIODE

(71) Applicant: Commissariat à l'Énergie Atomique et aux Énergies Alternatives, Paris (FR)

(72) Inventor: Norbert Moussy, Sainte Agnes (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 16/325,369

(22) PCT Filed: Sep. 11, 2017

(86) PCT No.: PCT/FR2017/052406
§ 371 (c)(1),
(2) Date: Feb. 13, 2019

(87) PCT Pub. No.: WO2015/050996
PCT Pub. Date: Mar. 22, 2018

(65) Prior Publication Data
US 2019/0198701 A1    Jun. 27, 2019

(30) Foreign Application Priority Data

Sep. 13, 2016   (FR) .................................. 16 58513

(51) Int. Cl.
*H01L 31/107*       (2006.01)
*H01L 31/0368*      (2006.01)
(Continued)

(52) U.S. Cl.
CPC .... *H01L 31/107* (2013.01); *H01L 31/022408* (2013.01); *H01L 31/03529* (2013.01);
(Continued)

(58) Field of Classification Search
CPC .......... H01L 31/03529; H01L 31/1075; H01L 27/14643; H01L 31/107; H01L 31/03682; H01L 31/022408
(Continued)

(56) References Cited

U.S. PATENT DOCUMENTS

2009/0008566 A1*   1/2009  Agarwal et al. .... H01L 27/1464
                                                      257/438
2014/0312449 A1   10/2014  Jonak-Auer et al.
(Continued)

FOREIGN PATENT DOCUMENTS

FR            1658513           5/2017

OTHER PUBLICATIONS

International Search Report and Written Opinion for International Application No. PCT/FR2017/052406, dated Dec. 22, 2017.
(Continued)

*Primary Examiner* — Thinh T Nguyen
(74) *Attorney, Agent, or Firm* — Wolf, Greenfield & Sacks, P.C.

(57) ABSTRACT

A SPAD-type photodiode including: a semiconductor substrate of a first conductive type having a front side and a back side; and a first semiconductor region of the second conductivity type extending in the substrate from the front side thereof and towards the back side thereof, the lateral surfaces of the first region being in contact with the substrate and the junction between the lateral surfaces of the first region and the substrate defining an avalanche area of the photodiode.

13 Claims, 4 Drawing Sheets

(51) Int. Cl.
*H01L 31/0352* (2006.01)
*H01L 31/0224* (2006.01)

(52) U.S. Cl.
CPC .... *H01L 31/03682* (2013.01); *H01L 31/1075* (2013.01); *Y02E 10/50* (2013.01)

(58) Field of Classification Search
USPC .......... 257/49, 53, 435, 438; 438/91, 96, 97, 438/380
See application file for complete search history.

(56) References Cited

U.S. PATENT DOCUMENTS

| | | |
|---|---|---|
| 2015/0333210 A1 | 11/2015 | Teva et al. |
| 2016/0035929 A1 | 2/2016 | Teva et al. |

OTHER PUBLICATIONS

Preliminary Search Report for French Application No. 1658513, dated May 11, 2017.
Richardson et al., Scaling trends of single-photon avalanche diode arrays in nanometer CMOS technology. Proc. SPIE 8033, Advanced Photon Counting Techniques V. 2011;8033:80330B-1-8.
PCT/FR2017/052406, dated Dec. 22, 2017, International Search Report and Written Opinion.
International Preliminary Report on Patentability for International Application No. PCT/FR2017/052406, dated Mar. 28, 2019.

\* cited by examiner

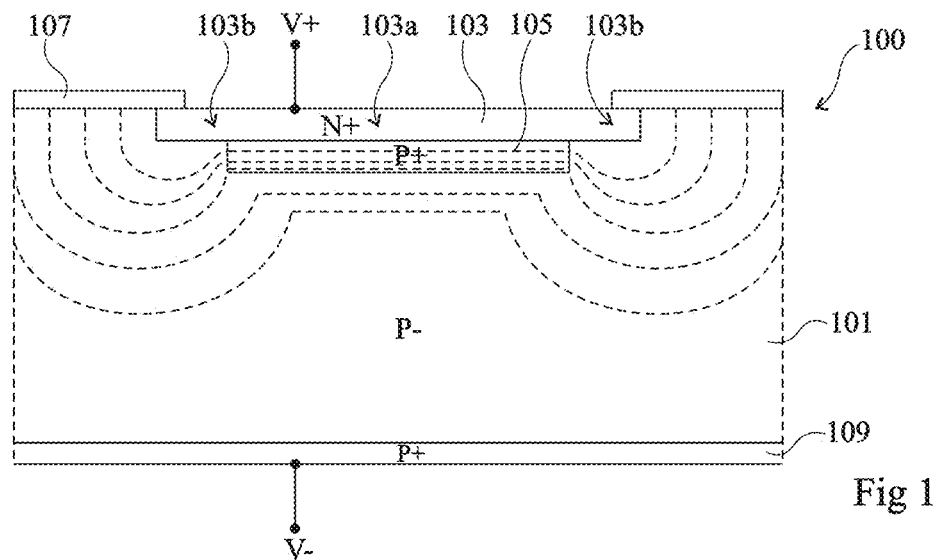
Fig 1
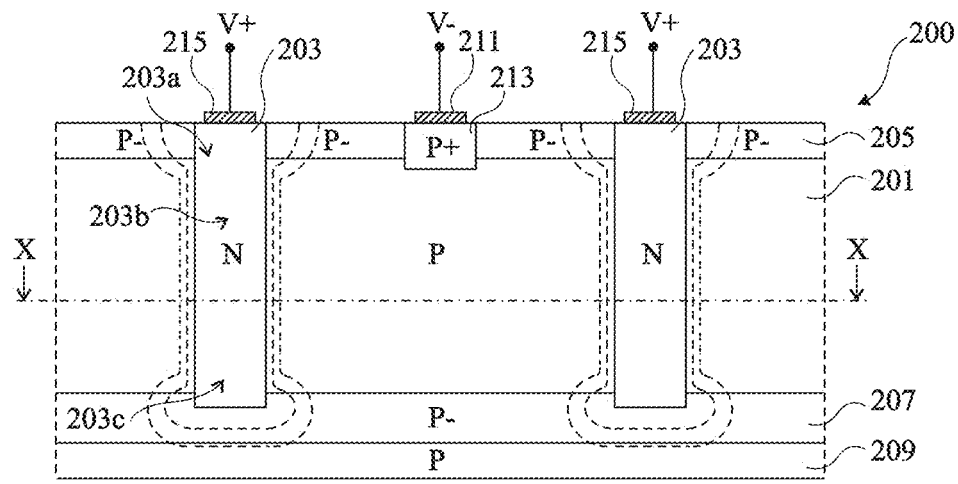
Fig 2
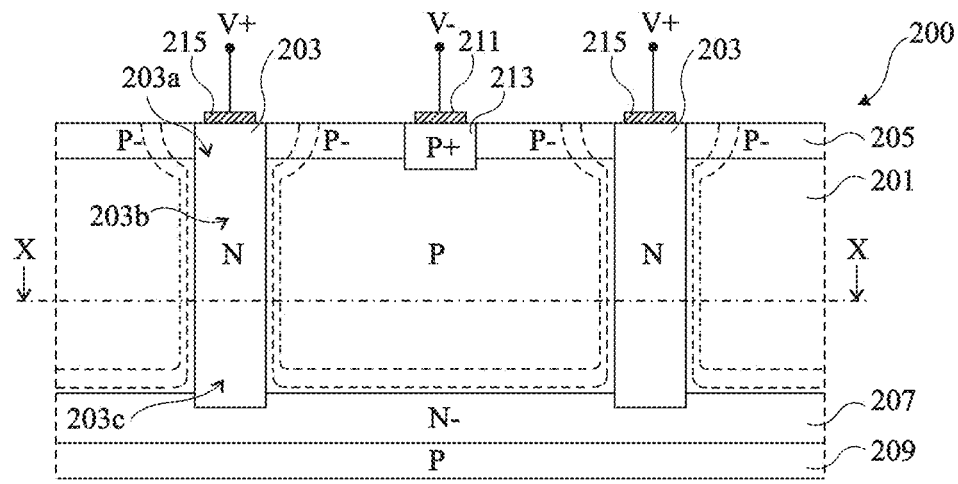
Fig 2 bis

Fig 2 ter

SPAD PHOTODIODE

This application is a national stage filing under 35 U.S.C. § 371 of International Patent Application Serial No.: PCT/FR2017/052406, filed on Sep. 11, 2017, which claims priority to French patent application FR16/58513, filed Sep. 13, 2016. The entire contents of these applications are incorporated herein by reference in their entirety.

BACKGROUND

The present application relates to the field of avalanche photodiodes for the detection of single photons, also called SPAD "Single Photon Avalanche Diode") photodiodes.

DISCUSSION OF THE RELATED ART

A SPAD photodiode is essentially formed by a reverse-biased PN junction at a voltage greater than its avalanche threshold. When no electric charge is present in the depletion area or space charge area of the PN junction, the photodiode is in a non-conductive pseudo-steady state. When a photo-generated electric charge is injected into the depletion area, if the displacement speed of this charge in the depletion area is sufficiently high, that is, if the electric field in the depletion area is sufficiently intense, the photodiode is capable of avalanching. A single photon is thus capable of generating a measurable electric signal, and this, with a very short response time. SPAD photodiodes enable to detect radiations of very low light intensity, and are in particular used for single photon detection and photon counting.

It would be desirable to at least partly improve certain aspects of known SPAD photodiodes.

SUMMARY

Thus, an embodiment provides a SPAD-type photodiode comprising: a semiconductor substrate of a first conductive type having a front side and a back side; and a first semiconductor region of the second conductivity type extending in the substrate from the front side thereof and towards the back side thereof, the lateral surfaces of the first region being in contact with the substrate and the junction between the lateral surfaces of the first region and the substrate defining an avalanche area of the photodiode.

According to an embodiment, the photodiode further comprises a first metallization for biasing the substrate, located on the front side of the substrate, and a second metallization for biasing the first region, located on the front surface of the first region.

According to an embodiment, the first region comprises a plurality of semiconductor bars or tubes of the second conductivity type extending in the substrate.

According to an embodiment, the distance, in transverse cross-section, between two neighboring bars or tubes of the first region is shorter than or equal to 3 µm.

According to an embodiment, the first region extends in the substrate down to a depth in the range from 5 to 25 µm.

According to an embodiment, the photodiode further comprises a first semiconductor layer coating the back side of the substrate, the first region thoroughly crossing the substrate and stopping in the first layer, the first layer being doped with the first conductivity type and having a doping level lower than that of the substrate, or the first layer being doped with the second conductivity type and having a doping level lower than that of the first region.

According to an embodiment, the photodiode further comprises a second semiconductor layer coating the front side of the substrate, the first region thoroughly crossing the second layer, the second layer being doped with the first conductivity type and having a doping level lower than that of the substrate.

According to an embodiment, the photodiode further comprises a local doped region of the second conductivity type, having a doping level lower than that of the first region, extending in the substrate from the upper surface thereof and laterally surrounding the first region.

According to an embodiment, the substrate is made of silicon, the first region being formed by filling, with polysilicon having a conductivity type opposite to that of the substrate, a trench formed in the substrate.

According to an embodiment, the substrate rests, on its back side, on an insulating layer, and the first region thoroughly crosses the substrate and stops on the front surface of the insulating layer.

According to an embodiment, the first region is formed by partially filling, with polysilicon having a conductivity type opposite to that of the substrate, a trench formed in the substrate, the trench being then filled with an insulating material to obtain an insulating wall coupling the front surface of the insulating layer to the front side of the substrate.

BRIEF DESCRIPTION OF THE DRAWINGS

The foregoing and other features and advantages will be discussed in detail in the following non-limiting description of specific embodiments in connection with the accompanying drawings, among which:

FIG. 1 is a partial simplified lateral cross-section view of an example of a SPAD photodiode;

FIG. 2 is a partial simplified lateral cross-section view of an embodiment of a SPAD photodiode;

FIG. 2bis is a partial simplified lateral cross-section view of an alternative embodiment of a SPAD photodiode;

FIG. 2ter is a partial simplified lateral cross section view of another alternative embodiment of a SPAD photodiode;

DETAILED DESCRIPTION

Figure 3:
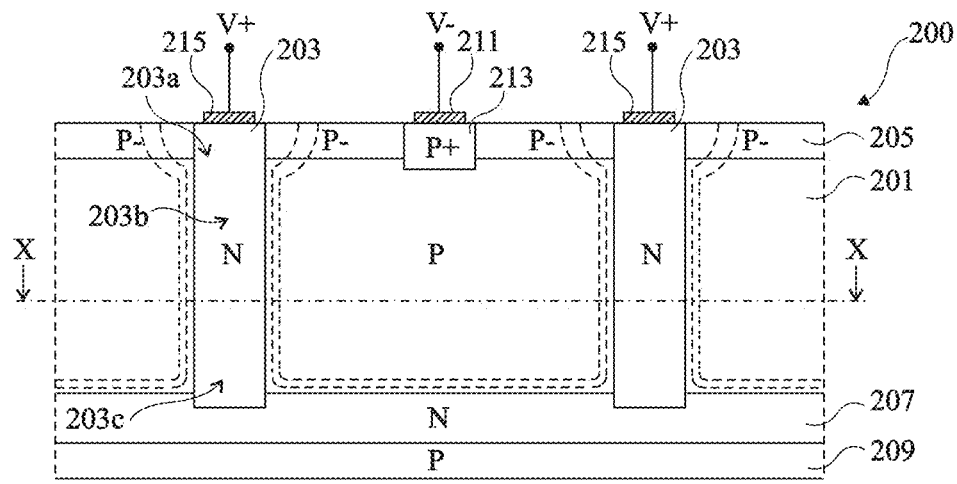
FIG. 3 is a partial simplified lateral cross-section view of another embodiment of a SPAD photodiode.
Figure 3:
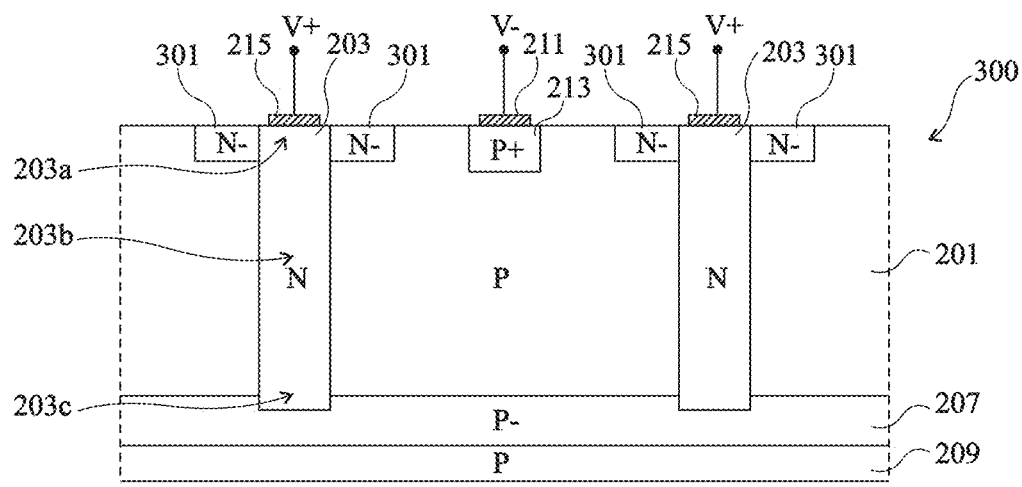

The same elements have been designated with the same reference numerals in the different drawings and, further, the various drawings are not to scale. For clarity, only those elements which are useful to the understanding of the described embodiments have been shown and are detailed. In particular, a SPAD-type photodiode generally comprises secondary circuits, particularly a circuit for biasing its PN junction to a voltage greater than its avalanche threshold, a readout circuit capable of detecting that an avalanche of the photodiode has been triggered, as well as a quenching circuit having the function of interrupting the avalanche of the photodiode once the latter has been triggered. Such secondary circuits have not been shown in the drawings and will not be detailed, the described embodiments being compatible with the secondary circuits equipping known SPAD photodiodes. In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", "lateral", etc., it is referred to the orientation of the cross-section views of FIG. 1, 2, 3, or 4, it being understood that, in practice, the described photodiodes may be oriented differently. The terms "approximately" "substantially", and "in the order of are used herein to designate a tolerance of plus or minus 10%, preferably of plus or minus 5%, of the value in question or, when they concern angles or absolute or relative angular orientations, a tolerance of plus or minus 10 degrees, preferably of plus or minus 5 degrees, of the value in question.

A problem which is posed in known SPADs is that of the collection of the charges photogenerated in depth in the substrate, at a distance remote from the avalanche area of the photodiode, that is, the portion of the photodiode depletion area where the electric field is sufficiently intense for the avalanche to be triggered by a single charge. Indeed, beyond a certain distance from the PN junction, the electric field resulting from the reverse biasing of the PN junction becomes zero or strongly attenuates, and no longer enables to drive the photogenerated charges towards the avalanche area. Only the random diffusion in the substrate is then capable of driving the photogenerated charges towards the avalanche area, with a non-negligible probability for the photogenerated charges never to reach the avalanche area or to reach it with a significant delay. This problem is especially posed when charges photogenerated under the effect of a luminous radiation of high wavelength, for example, a radiation having a wavelength in the range from 750 to 1,200 nm in silicon, are desired to be collected.

FIG. 1 is a partial simplified cross-section view of an example of a SPAD 100. Photodiode 100 comprises a semiconductor substrate 101, for example, made of silicon. In the shown example, substrate 101 is P-type doped (P−). Photodiode 100 further comprises, in an upper portion of substrate 101, an N-type doped region 103 (N+) extending from the upper surface of the substrate and, under region 103, a P-type doped region 105 (P+) having a doping level greater than that of substrate 101, extending from the lower surface of region 103. Region 105 has, in top view, a surface lower than that of region 103 and is located opposite a central portion 103a of region 103. A ring-shaped peripheral region 103b of region 103 thus extends laterally beyond the periphery of region 105. The lower surface of central region 103a of region 103 is in contact with the upper surface of region 105, and the lower surface and the lateral surface of peripheral region 103b of region 103 are in contact with substrate 101. Thus, the PN junction of photodiode 100 comprises a central portion formed between region 105 and central portion 103a of region 103, and a peripheral portion formed between substrate 101 and peripheral portion 103b of region 103. In the shown example, photodiode 100 further comprises a passivation layer 107, for example, made of silicon oxide, coating the upper surface of substrate 101 at the level of the photodiode periphery. Further, in this example, photodiode 100 comprises, in a lower portion of substrate 101, a P-type doped region 109 (P+), having a doping level lower than that of the substrate, extending in substrate 101 from its lower surface over substantially the entire surface of the photodiode.

As an example, the thicknesses of regions 103 and 105 are in the range from a few tens to a few hundreds of nanometers, and the thickness of substrate 101 located under region 105, that is, between the lower surface of region 105 and the upper surface of layer 109 in the shown example, is in the range from a few micrometers to a few hundreds of micrometers.

In operation, region 103, forming the photodiode cathode, is biased to a positive potential V+, and region 105, forming the photodiode anode, is biased to a negative potential V−, so that the cathode-anode voltage of the photodiode is greater than its avalanche voltage. In the example of FIG. 1, the contact terminals enabling to bias the photodiode have not been detailed. As an example, the anode of the photodiode is biased via region 109. The cathode of the photodiode may be biased via a contact metallization located on the front surface of region 103.

When photodiode 100 is reverse-biased, an electric field appears at the PN junction of the photodiode. FIG. 1 shows in dash lines the equipotential lines in substrate 101 when photodiode 100 is reverse biased. The electric field (not shown) in the photodiode is orthogonal to the equipotential lines, and is all the more intense as the equipotential lines are close to one another. The space charge area of the PN junction and the electric field resulting from a reverse biasing of the PN junction extend all the deeper into substrate 101 as the reverse biasing voltage of die photodiode is high, and as the encountered doping levels are low. For a given bias voltage, the electric field generated at the PN junction is all the more intense as the doping levels of the P- and N-type regions forming the junction are high.

In practice, the doping levels of regions 103 and 105 and of substrate 101 and the photodiode bias voltage are selected so that the electric field at the central portion of the PN junction (at the interface between region 105 and central portion 103a of region 103) is sufficiently intense for the avalanche to be triggered by a single photogenerated charge, and so that the electric field at the peripheral portion of the PN junction (at the interface between substrate 101 and peripheral portion 103b of region 103) is sufficiently low for the avalanche not to be triggered by a single photogenerated charge. This enables to decrease risks of spurious triggering of the avalanche due to edge effects at the periphery of the PN junction.

To enable to collect charges photogenerated in depth in substrate 101, that is, under region 105, a solution is to use a substrate 101 having a very low doping level, for example, lower than $5*10^{14}$ atoms/cm$^3$. As an example, substrate 101 may be a non-intentionally doped semiconductor substrate, that is, a substrate having its P-type doping only resulting from its incidental contamination by impurities on manufacturing thereof. This enables the electric field generated by the reverse biasing of the photodiode to extend in depth in the substrate. Under the effect of this electric field, the charges photogenerated in the substrate, in the case in point, electrons, are driven towards the PN junction by following a trajectory parallel to the electric field. As a variation, the extension of the electric field across the substrate thickness may also be obtained with a substrate having a higher doping level, provided to significantly increase the reverse bias voltage of the photodiode.

Another solution (not shown) to enable to collect charges photogenerated depth in the substrate is to bury the PN junction of the photodiode (that is, regions 103 and 105 of FIG. 1) in depth in the substrate, to shorten the path that charges photogenerated in depth should travel to reach the avalanche area. In this case, the collection of the photogenerated charges towards the avalanche area, instead of being assisted by an electric field, may result from the random diffusion of the charges in the substrate.

An object of an embodiment is to provide a solution which is an alternative to the above-mentioned solutions, enabling to efficiently collect charges photogenerated in depth or at the surface in the semiconductor substrate.

FIG. 2 is a partial simplified lateral cross-section view of an embodiment of a SPA photodiode 200.

Photodiode 200 comprises a semiconductor substrate 201, for example, made of silicon having, in the orientation of FIG. 2, substantially horizontal upper and lower surfaces. In this example, substrate 201 is P-type doped (P). Further, in this example, substrate 201 is topped with a P-type doped layer 205 (P−) having a doping level lower than that of the substrate, and having its lower surface in contact with the upper surface of the substrate. In the shown example, the substrate further rests on a P-type doped layer 207 (P−), having a doping level lower than that of the substrate, and having its upper surface in contact with the lower surface of the substrate. In this example, layer 207 itself rests on a P-type doped layer 209, having a doping level greater than that of layer 207, and having its upper surface in contact with the lower surface of layer 207. As an example, layer 209 may be a support substrate, having layer 207, and then substrate 201, and then layer 205, formed by epitaxy on its upper surface. As an example, the thickness of substrate 201 is in the range from 1 to 25 µm, and layers 205 and 207 each have a thickness in the range from 50 nm to 1 µm.

Photodiode 200 further comprises a local N-type doped region 203 (N) extending in substrate 201 from the upper surface of the substrate over a portion only of the photodiode surface. Region 203 extends relatively deeply in substrate 201, typically down to a depth of a plurality of micrometers, for example, down to a depth in the range from 5 to 25 µm. In the shown example, region 203 extends from the upper surface of layer 205, thoroughly crosses layer 205 and substrate 201, and stops in layer 207. Thus, in an upper portion 203a of region 203, the lateral surfaces of region 203 are in contact with layer 205, in a central portion 203b of region 203, the lateral surfaces of region 203 are in contact with substrate 201, and in a lower portion 203c of region 203, the lateral surfaces and the lower surface of region 203 are in contact with layer 207.

Substrate 201 forms the anode of photodiode 200 and region 203 forms the cathode of photodiode 200. According to an aspect of the embodiment of FIG. 2, the PN junction formed between the lateral surfaces of region 203 and substrate 201 defines the avalanche area of photodiode 200. In other words, in the embodiment of FIG. 2, the active portion of the PN junction of photodiode 200, that is, the portion of the PN junction where the avalanche may be triggered by a single photogenerated charge, extends along a plane which is not parallel to the upper surface of substrate 201, for example, a plane substantially orthogonal to the upper surface of substrate 201. This is a difference with respect to the example of FIG. 1 where the active portion of the PN junction is horizontal, that is, parallel to the upper and lower surfaces of the substrate.

Region 203 for example comprises one or a plurality of N-type doped silicon fingers, extending in substrate 201 from the upper surface thereof, for example along a substantially vertical direction. As a variation, region 203 may have the shape of a tube with a substantially vertical central axis, extending in substrate 201 from the upper surface thereof.

As an example, to form region 203, a trench is first formed, for example, by etching, from the upper surface of the stack comprising layers 209 and 207, substrate 201, and layer 205, the trench crossing layer 205 and substrate 201 and stopping in layer 207, after which the trench is filled with N-type doped polysilicon to form region 203.

As a variation, the N-type doped polysilicon forming region 203 is deposited on the lateral walls and on the bottom of the trench to only partially fill the trench. A material opaque to the radiation to be detected, for example, a metal or a metal alloy, for example, a tungsten-silicon alloy, is then deposited, for example, by a conformal deposition method, for example, by chemical vapor deposition (CVD), on the lateral walls and on the bottom of the trenches. The trench may then be filled with an electrically-insulating material, for example, an oxide deposited by a conformal deposition method, for example, by a SACVD-type (Sub-Atmospheric Chemical Vapor Deposition) or HARP-type (High Aspect Ratio Process) method.

An advantage of such a variation is that it enables to make the trenches defining cathode regions 203 of the photodiodes opaque. Indeed, when a photodiode avalanches, the avalanche area emits photons and there is a risk for the photons to cause an avalanche in another neighboring photodiode of the device. The provision of opaque trenches limits such a risk.

Photodiode 200 of FIG. 2 further comprises an anode contact metallization 211 arranged above the upper surface of substrate 201 and electrically coupled to substrate 201. In the shown example, a local P-type doped contacting region 213 (P+), having a doping level higher than or equal to that of the substrate, extends in layer 205 from the upper surface of layer 205 and continues all the way to the upper surface of substrate 201. Metallization 211 is arranged on top of and in contact with contacting region 213.

Photodiode 200 of FIG. 2 further comprises a cathode contact metallization 215 arranged above the upper surface of region 203 and electrically coupled to region 203. In the shown example, metallization 215 is arranged on top of and in contact with the upper surface of region 203. An N-type doped contacting region (not shown), having a doping level higher than that of region 203, may possibly be provided in the upper portion of region 203, metallization 215 being then arranged on top of and in contact with the upper surface of the contacting region.

In operation, region 203, forming the photodiode cathode, is biased to a positive potential V+ via contact metallization 215, and substrate 201, forming the photodiode anode, is biased to a negative potential V− via contact metallization 211, so that the cathode-anode voltage of the photodiode is greater than its avalanche voltage.

As in the example of FIG. 1, when photodiode 200 is reverse biased, an electric field appears at the PN junction of the photodiode. FIG. 2 shows in dash lines equipotential lines in the semiconductor structure when photodiode 200 is reverse biased. As appears in the drawing, due to the fact that the doping level of layers 205 and 207 is lower than the doping level of substrate 201, the equipotential lines are more distant from one another at the level of the upper portion (at the interface between layer 205 and upper portion 203a of region 203) and of the lower portion (at the interface between layer 207 and lower portion 203c of region 203) of the PN junction of the photodiode than at the level of the central portion (at the interface between substrate 201 and central portion 203b of region 203) of the PN junction. As a result, the electric field generated at the level of the upper and lower portions of the PN junction is less intense than the electric field generated at the level of the central portion of the PN junction.

The doping levels of substrate 201, of layers 205 and 207, and of region 203 and the diode bias voltage are preferably selected so that the electric field at the level of the central portion of the PN junction is sufficiently intense for the avalanche to be triggered by a single photogenerated charge, for example, is greater than 300 kV/cm over a distance from 100 to 500 nm along a direction orthogonal to the PN junction, and so that the electric field at the level of the upper portion and at the level of the lower portion of the PN junction is sufficiently low for the avalanche not to be triggered by a single photogenerated charge, for example, is smaller than 300 kV/cm. As an example, the reverse breakdown voltage (or avalanche voltage) of the photodiode is in the range from 10 to 50 V, and the reverse bias voltage of the photodiode is greater than its breakdown voltage by a value in the range from 0.5 to 10 V. The doping level of substrate 201 is for example in the range from $5*10^{16}$ to $7*10^{17}$ atoms/cm$^3$. The doping level of region 203 is for example in the range from $1*10^{17}$ to $1*10^{19}$ atoms/cm$^3$. The doping level of layers 205 and 207 is for example lower than $5*10^{16}$ atoms/cm$^3$.

When a charge is photogenerated in substrate 201 within a radius of a few micrometers around the PN junction and down to a depth in the order of the depth of region 203, the charge laterally diffuses into the substrate and there is a significant probability for this charge to reach the avalanche area of the photodiode and to cause the triggering thereof. Thus, the photodiode of FIG. 2 enables to efficiently collect charges photogenerated in depth in the substrate, like charge photogenerated in an upper portion of the substrate. In particular, in the photodiode of FIG. 2, the mean time which elapses between the photogeneration of a charge in substrate 201 and the collection of the charge in the avalanche area of the photodiode is substantially independent from the depth at which the charge has been photogenerated in the substrate.

It should be noted that the photodiode of FIG. 2 is capable of being illuminated either on the front side of substrate 201, or on the back side of substrate 201. In this last case, a thinning, or even a total removal of lower layer 209, may possibly be provided. An advantage of the photodiode of FIG. 2 is that when it is illuminated from its front side, anode contact metallization 211 is not located on the path of light and accordingly does not decrease the photodiode sensitivity.

In the example of FIG. 2, upper and lower layers 205 and 207 of lower doping level than substrate 201 enable to decrease risks of spurious triggering of the avalanche due to edge effects at the ends of the PN junction. Such layers are however optional, and other solutions may be provided to control risks of spurious triggering due to field effects, for example, by varying the shape of the upper and lower ends of region 203 or by decreasing the N-type doping level of region 203 at the upper and lower ends thereof. Further, a similar effect of decrease of risks of spurious triggering may be obtained by replacing lower P-type layer 207 with an N-type layer having a doping level lower than that of region 203.

FIG. 2*bis* is a partial simplified lateral cross-section view illustrating an alternative embodiment of the SPAR photodiode 200 of FIG. 2, where lower layer 207 is an N-type layer having a doping level lower than that of region 203.

An advantage of such a configuration is that the electrons generated in the lower portion of the photodiode, that is, in substrate 201 in the vicinity of the interface with layer 207, or in layer 207, or also in layer 209, are pushed hack under substrate 201 by the vertical electric field created by the horizontal PN junction formed between substrate 201 and layer 207. Such electrons thus cannot rise back to the avalanche area of the photodiode. This enables to limit crosstalk phenomena, that is, phenomena of spurious triggering by electrons photogenerated in neighboring photodiodes, which may propagate by diffusion under region 203 when layer 207 is of type P.

Further, this enables to minimize the mean time of collection of the photogenerated charges, since only the charges generated in substrate 201, between regions 203, are capable of triggering the avalanche.

It should further be noted that in the case of a back-side illuminated structure, that is, a structure intended to be illuminated on its back side, support substrate 209 may be thinned or even totally removed. The provision of an N-type layer 207 is then particularly advantageous. Indeed, this enables possible spurious electrons generated by defects at the lower surface side of layer 207 or 209 to remain confined in layer 207, and thus not to trigger the avalanche. In other words, layer 207 passivates the lower surface of the photodiode. It can then in particular be provided to optically treat the lower surface of the photodiode, for example, by deposition of one or of a plurality of reflection layers, or also by forming surface structures, to favor the penetration of light into substrate 201, without fearing to increase the risk of spurious triggering (and thus the noise).

FIG. 2*ter* is a partial simplified lateral cross-section view illustrating another alternative embodiment of the SPAD photodiode 200 of FIG. 2, where lower layer 207 is an N-type layer having a doping level substantially identical to that of region 203.

In this example, the avalanche area of the photodiode comprises not only the vertical PN junction formed between the lateral surfaces of region 203 and substrate 201, but also the horizontal PN junction formed between layer 207 and substrate 201.

As compared with the configuration of FIG. 2*bis*, a difference is that the electrons photogenerated in the lower portion of substrate 201 in the vicinity of the interface with layer 207, instead of being discharged towards layer 207 without triggering the avalanche, now cause the avalanche and are thus detected by the SPAD photodiode. Similarly, the holes photogenerated in layer 207 cross the junction to reach substrate 201, here again causing the avalanche. This enables to increase the sensitivity of the device.

Figure 4:
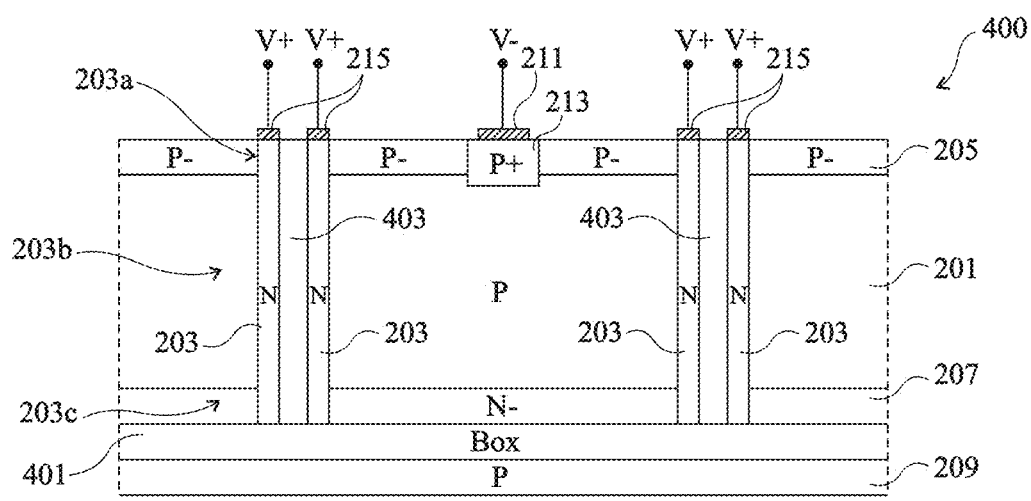
FIG. 4 is a partial simplified lateral cross-section view of another embodiment of a SPAD photodiode.

It should be noted that in the case of a back-side illuminated structure or in the case of a structure formed from a SOI-type substrate of the type described hereabove in relation with FIG. 4, spurious holes may be generated by interface defects at the lower surface level of layer 207 or 209. Such spurious holes are capable of crossing the horizontal PN junction between layer 207 and substrate 201, thus generating spurious triggering phenomena. To limit such a phenomenon, layer 207 or 209 should be relatively heavily doped at its lower surface. As an example, layer 207 may have a decreasing doping level gradient between its lower surface and its upper surface. The breakdown voltage of the PN junction between layer 207 and substrate 201 may be adjusted by one or a plurality of diffusion anneals to be substantially equal to the breakdown voltage of vertical junctions between regions 203 and substrate 201.

For the rest, the structure of FIG. 2*ter* has substantially the same advantages as the structure of FIG. 2*bis*.

It should be noted that in the examples of FIGS. 2*bis* and 2*ter*, support substrate 209 is of type P. However, substrate 209 may be N-type doped. In this case, layer 207 and substrate 209 may possible be confounded.

In the structures of FIGS. 2, 2*bis*, and 2*ter*, the PN junction formed between substrate 201 and region 203 is preferably repeated a plurality of times to increase chances of capturing charges photogenerated in the substrate. Examples of SPAD photodiodes where region 203 is repeated a plurality of times are illustrated in FIGS. 5, 6, and 7.

FIGS. 5, 6, 7, and 8 are transverse cross-section views of SPAD photodiodes of the type described in relation with FIGS. 2, 2*bis*, and 2*ter*, along a horizontal cross-section plane X-X (FIG. 2) crossing substrate 201.

Figure 5:
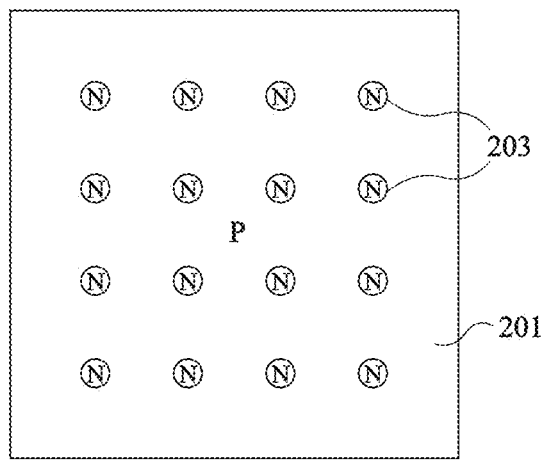
FIGS. 5, 6, 7, and 8 are partial simplified transverse cross-section views illustrating examples of SPAD photodiodes according to an embodiment.

FIG. 5 illustrates an example of a SPAD photodiode, where region 203 comprises a plurality of substantially vertical N-type bars having a circular cross-section, regularly distributed, in top view, across the surface of the photodiode. Each bar may be topped with a cathode contact metallization 215 (not shown in FIG. 5) contacting the bar. The metallizations 215 topping the different bars may be interconnected. Anode contact metallization 211 (not shown in FIG. 5) may be a single metallization, for example, arranged in a central portion of the photodiode, or a distributed metallization comprising a plurality of interconnected portions regularly distributed above the upper surface of the photodiode.

Figure 6:
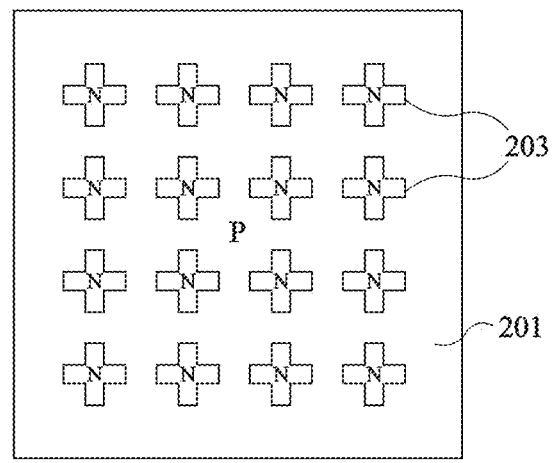
Figure 7:
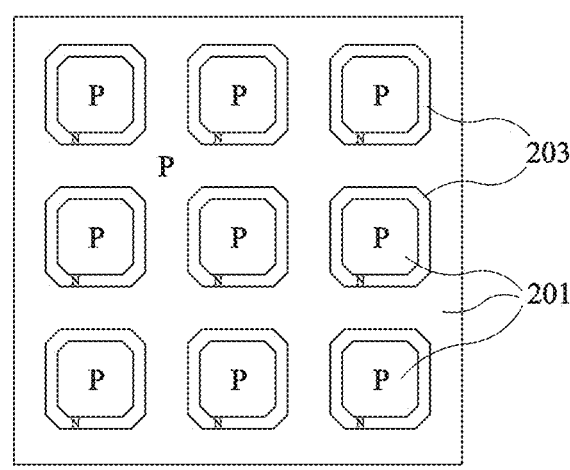

FIG. 6 illustrates another example of a SPAD photodiode, which differs from the example of FIG. 5 mainly in that, in the example of FIG. 6, the N-type bars of region 203 have a cross-shaped transverse cross-section.

FIG. 7 illustrates another example of a SPAD photodiode, where region 203 comprises a plurality of N-type tubes having substantially vertical central axes, regularly distributed in top view across the photodiode surface. In the shown example, each N-type tube has, in transverse cross-section, a square shape with rounded corners. Each N-type tube of region 203 may be topped with a cathode contact metallization 215 (not shown in FIG. 5), for example, a ring-shaped metallization, contacting the upper surface of the tube. Further, the substrate portion 201 located inside of each N-type tube of region 203 may be topped with an anode contact metallization 211 (not shown in FIG. 5), contacting the upper surface of the substrate portion. The cathode contact metallizations 215 topping the different N-type tube-shaped regions may be connected together. Further, the anode contact metallizations 211 topping the substrate portions 201 contained in the different N-type tube-shaped regions may be interconnected.

Figure 8:
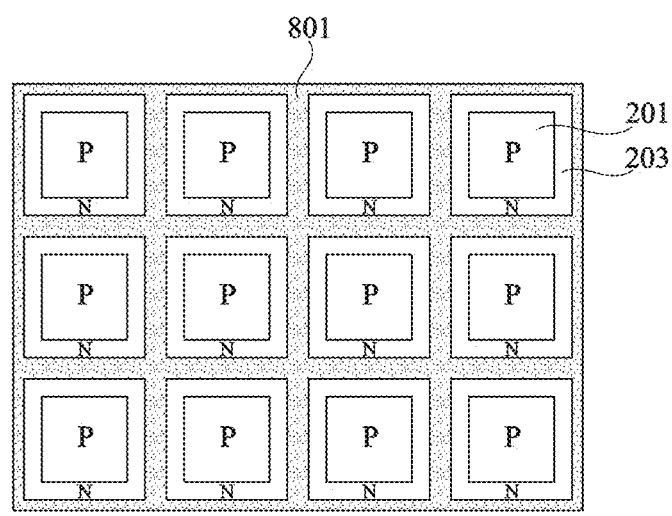

FIG. 8 illustrates an alternative embodiment of the SPAD photodiode of FIG. 7. FIG. 8 corresponds to a simplified top view of a structure of the type described hereafter in relation with FIG. 4. In this example, the different N-type tube-shaped regions are separated from one another only by a vertical insulating region 801, for example, a region opaque for the radiation to be detected. Region 801 for example corresponds to insulating wail 403 of the structure of FIG. 4.

In the examples of FIGS. 5, 6, 7, and 8, or, more generally, when region 203 of the photodiode is repeated a plurality of times, the cathode contact metallizations 215 topping the different regions 203 may be interconnected by groups of a plurality of neighboring regions 203, to obtain wider detection areas sharing a same electric connection. Indeed, the light detection area is for example limited to a few micrometers around each region 203. By the gathering of a plurality of neighboring regions 203 on a same electric connection, detection pixels having greater dimensions are obtained.

Further, when region 203 of the photodiode is repeated a plurality of times to increase the photogenerated charge collection surface area, the distance (in transverse cross-section) between two neighboring regions 203 may be selected to maintain a reasonable collection time for charges photogenerated at an equal distance between two neighboring regions 203 of the structure. As an example, the distance between two neighboring regions 203 of the structure is shorter than 3 µm.

FIG. 3 is a partial simplified lateral cross-section view of another embodiment of a SPAD 300. SPAD 300 of FIG. 3 comprises many structural and functional features in common with SPAD 200 of FIG. 2. Such common features are not described again hereafter. Hereafter, only the differences with respect to the SPAD photodiode 200 of FIG. 2 will be detailed.

SPAD photodiode 300 differs from SPAD photodiode 200 mainly in that it comprises no P-type upper layer 205 more lightly doped than substrate 201, topping substrate 201.

SPAD photodiode 300 however comprises, at the level of upper portion 203*a* of region 203, a local N-type doped region 301 (N−), having a doping level lower than that of region 203, extending in substrate 201 from the upper surface of the substrate and laterally surrounding region 203. Region 301 for example extends in substrate 201 down to a depth in the range from 50 to 500 nm. At the level of upper portion 203*a* of region 203, the lateral surfaces of region 203 are in contact with region 301. The upper portion of the PN junction of the photodiode thus corresponds to the interface between region 301 and substrate 201. Due to the fact that the N-type doping level of region 301 is lower than that of region 203, the electric field generated at the level of the upper portion of the PN junction is less intense than the electric field generated at the level of the central portion of the PN junction. Thus, region 301 enables to limit risks of spurious triggering of the photodiode, due to edge effects at the upper end of region 203. As a variation, region 301 may have a lateral doping level gradient, so that its N-type doping level progressively decreases as the distance to region 203 increases.

It should be noted that the variation of FIG. 3 may be combined with the variation of FIG. 2*bis* or 2*ter*.

FIG. 4 is a partial simplified lateral cross-section view of another embodiment of a SPAD 400. The SPAD photodiode 400 of FIG. 4 comprises many structural and functional features in common with the SPAD photodiode 200 of FIG. 2. Such common features are not described again hereafter. Hereafter, only the differences with respect to SPAD photodiode 200 of FIG. 2 will be detailed.

In the example of FIG. 4, photodiode 400 is formed from a silicon-on-insulator (SOI) substrate. Layer 209 corresponds to the support substrate of the SOI stack. An insulating layer 401 (BOX), for example, made of silicon oxide, is arranged on top of and in contact with the upper surface of layer 209. Insulating layer 401 is itself topped with the stack of layers 207, 201, and 205. In the shown example, lower layer 207 is an N-type layer having a doping level lower than that of region 203, and upper layer 205 is a P-type layer having a doping level lower than that of substrate 201.

In the example of FIG. 4, region 203 is located at the periphery of a trench extending from the upper surface of layer 205, thoroughly crossing layer 205, substrate 201, and layer 207, and emerging onto the upper surface of insulating layer 401. After the forming of the trench, N-type doped polysilicon is deposited on the lateral walls of the trench to partially fill the trench. The polysilicon may be removed from the bottom of the trench. The trench is then filled with an insulating material, for example, silicon oxide, to form an insulating wall 403 coupling layer 401 to the upper surface of layer 205.

The configuration of FIG. 4 is particularly advantageous in the case where region 203 is tube-shaped, for example, of the type shown in FIG. 7. Indeed, in this case, the P-type portion of substrate 201 located within N-type tube 203 is fully insulated from the rest of substrate 201 by insulating layer 401 and by peripheral insulating wall 403. This enables to contain the high-voltage biasing of substrate 201. This particularly eases the integration of other components (not shown) inside and on top of the same substrate 201 as the SPAD photodiode.

It should be noted that the variation of FIG. 4 may be combined with the variations of FIG. 2 or 2ter and/or of FIG. 3.

Specific embodiments have been described. Various alterations, modifications, and improvements will occur to those skilled in the art. In particular, the described embodiments are not limited to the numerical examples of dimensions and of doping levels mentioned in the description.

Further, the above-described advantages can be obtained by inverting all the conductivity types with respect to the examples described in relation with FIGS. 2 to 8.

The invention claimed is:

1. A SPAD-type photodiode comprising:
   a semiconductor substrate of a first conductivity type having a front side and a back side;
   a first semiconductor region of the second conductivity type extending in the substrate from the front side thereof and towards the back side thereof, the lateral surfaces of the first region being in contact with the substrate and the junction between the lateral surfaces of the first region and the substrate defining an avalanche area of the photodiode; and
   a first semiconductor layer coating the back side of the substrate, the first region thoroughly crossing the substrate and stopping in the first layer, the first layer being doped with the second conductivity type.

2. The photodiode of claim 1, wherein the first layer has a doping level lower than that of the first region.

3. The photodiode of claim 1, wherein the first layer has substantially the same doping level as the first region, and wherein the junction between the first layer and the substrate defines an additional avalanche area of the photodiode.

4. The photodiode of any of claim 1, further comprising a first metallization for biasing the substrate, located on the front side of the substrate, and a second metallization for biasing the first region, located on the front surface of the first region.

5. The photodiode of claim 1, wherein the first region comprises a plurality of semiconductor bars or tubes of the second conductivity type extending in the substrate.

6. The photodiode of claim 5, wherein the distance, in transverse cross-section, between two neighboring bars or tubes of the first region is shorter than or equal to 3μm.

7. The photodiode of claim 1, wherein the first region extends in the substrate down to a depth in the range from 5 to 25 μm.

8. The photodiode of claim 1, further comprising a second semiconductor layer coating the front side of the substrate, the first region thoroughly crossing the second layer, the second layer being doped with the first conductivity type and having a doping level lower than that of the substrate.

9. The photodiode of claim 1, further comprising a local doped region of the second conductivity type, having a doping level lower than that of the first region, extending in the substrate from the upper surface thereof and laterally surrounding the first region.

10. The photodiode of claim 1, wherein the substrate is made of silicon, the first region being formed by filling, with polysilicon having a conductivity type opposite to that of the substrate, a trench formed in the substrate.

11. The photodiode of claim 10, wherein the first region is formed by partial filling, with polysilicon having a conductivity type opposite to that of the substrate, a trench formed in the substrate, the trench further comprising a layer of an opaque material coating the polysilicon, and an insulating material ensuring the filling of the trench.

12. The photodiode of claim 1, wherein the substrate rests, on its back side, on an insulating layer, and wherein the first region thoroughly crosses the substrate and stops on the front side of the insulating layer.

13. The photodiode of claim 12, wherein the first region is formed by partially filling, with polysilicon having a conductivity type opposite to that of the substrate, a trench formed in the substrate, the trench being then filled with an insulating material to obtain an insulating wall coupling the front surface of the insulating layer to the front side of the substrate.

* * * * *